United States Patent
Arnold et al.

(10) Patent No.: US 9,215,807 B2
(45) Date of Patent: Dec. 15, 2015

(54) SMALL FORM FACTOR STACKED ELECTRICAL PASSIVE DEVICES THAT REDUCE THE DISTANCE TO THE GROUND PLANE

(71) Applicants: Shawn X. Arnold, San Jose, CA (US); Jeffrey M. Thoma, Mountain View, CA (US)

(72) Inventors: Shawn X. Arnold, San Jose, CA (US); Jeffrey M. Thoma, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 319 days.

(21) Appl. No.: 13/626,858

(22) Filed: Sep. 25, 2012

(65) Prior Publication Data
US 2014/0085851 A1    Mar. 27, 2014

(51) Int. Cl.
| | |
|---|---|
| H05K 1/14 | (2006.01) |
| H05K 1/02 | (2006.01) |
| H05K 1/11 | (2006.01) |
| H05K 3/36 | (2006.01) |

(52) U.S. Cl.
CPC .............. *H05K 1/141* (2013.01); *H05K 1/0231* (2013.01); *H05K 1/111* (2013.01); *H05K 3/366* (2013.01); *H05K 2201/049* (2013.01); *H05K 2201/10045* (2013.01); *H05K 2201/10636* (2013.01); *Y10T 29/49133* (2015.01)

(58) Field of Classification Search
CPC ........... H01G 4/232; H01G 4/35; H01G 4/38; H01G 9/14; H01G 2/04; H01G 4/33; H01G 9/26; H01G 4/30; H01G 9/08; H01G 2/06; H01G 9/008; H01G 4/236; H01G 4/40; H01G 9/155; H01G 2/106; H01G 4/228; H01L 2924/0002; H01L 2924/00; H01L 23/50; H01L 2224/16225; H01L 2924/15311; H01L 2224/16; H01L 2224/45144; H01L 27/0805; H01L 2924/01078; H01L 2924/15312; H01L 2924/3011; H01L 2224/16235; H05K 1/141; H05K 1/0231; H05K 1/111
USPC .............. 361/328, 329, 522, 541, 306.2, 782; 174/260
See application file for complete search history.

(56) References Cited

U.S. PATENT DOCUMENTS

| | | | |
|---|---|---|---|
| 5,132,613 A | 7/1992 | Papae et al. | |
| 5,982,027 A | 11/1999 | Corisis | |
| 6,577,491 B1 | 6/2003 | Ohtsuka et al. | |
| 6,907,658 B2 | 6/2005 | Li | |
| 7,085,144 B2 * | 8/2006 | Taguchi et al. | 363/40 |
| 7,323,395 B2 * | 1/2008 | Huntington | 438/455 |
| 8,188,786 B2 | 5/2012 | Hsu et al. | |
| 2002/0195700 A1 * | 12/2002 | Li | 257/700 |

OTHER PUBLICATIONS

U.S. Appl. No. 13/592,037, filed Aug. 22, 2012.

* cited by examiner

*Primary Examiner* — Jenny L Wagner
*Assistant Examiner* — Ahmad D Barnes
(74) *Attorney, Agent, or Firm* — Downey Brand LLP

(57) ABSTRACT

The described embodiments relate generally to electronic components and more specifically to a capacitor array that can increase component density on a printed circuit board and reduce a distance to a ground plane. An array of capacitors can be formed by coupling a group of capacitors on their sides interspersed with interposer boards. The resulting configuration can increase component density and reduce an amount of resistance and effective series inductance between a set of power decoupling capacitors and an integrated circuit.

20 Claims, 8 Drawing Sheets

SMALL FORM FACTOR STACKED ELECTRICAL PASSIVE DEVICES THAT REDUCE THE DISTANCE TO THE GROUND PLANE

FIELD OF THE DESCRIBED EMBODIMENTS

The described embodiments relate generally to electronic components and more specifically to a capacitor array that can increase component density on a printed circuit board and reduce a distance to a ground plane.

BACKGROUND

As technology advances, product designs in general, and designs for mobile products in particular are becoming smaller and smaller. Although the use of surface mount electronic components has enabled some amount of size reduction, product designs sizes are continuing to be driven smaller. Size reductions are now being hindered by the limitations brought on by the physical area taken up by the surface mount parts. In many cases space above a circuit board is wasted, such as for example when a single large component requires a certain amount of vertical space to be left above the circuit board while other component lie relatively flat.

In addition, new devices and technologies are using an increasing number of integrated circuits (ICs). Providing robust and reliable power and ground voltages to these ICs can be important for allowing the ICs to function correctly. Often, decoupling capacitors are used to manage the power supplied to an IC. A decoupling capacitor can act as a reservoir of charge, which is released when a power supply voltage at a particular current load drops below some tolerable level. Alternatively, decoupling capacitors can be an effective way to reduce the impedance of power delivery systems operating at high frequencies. The efficacy of a decoupling capacitor can depend on an amount of inductance and resistance included in the connection between the capacitor and the IC. In particular, longer distances between the capacitors and the IC can increase a likelihood that the IC will experience voltage dips that can cause malfunctions.

Therefore, what is desired is a reliable way to place a large number of passive devices such as capacitors a short distance from an IC while efficiently using the space available within an electrical device.

SUMMARY OF THE DESCRIBED EMBODIMENTS

This paper describes various embodiments that relate to a capacitor array that can increase component density on a printed circuit board and reduce a distance to a ground plane. In one embodiment, a capacitor array is disclosed. The capacitor array can include two monolithic capacitors, with each capacitor including a first terminal, a second terminal, and a dielectric material between the first and second terminals. The capacitors can be positioned so that a surface including both the first and second terminals and a minimum amount of surface area is oriented downwards. Furthermore, an interposer board can be positioned between the two capacitors. The interposer board can include conductive exterior surfaces and edges except for in regions that come into contact with the second terminals on the two capacitors. The interposer board can be mechanically and electrically coupled to the capacitors in a manner that electrically couples the first terminals of the two capacitors through the interposer board.

In another embodiment a system for decoupling a power supply to an integrated circuit is disclosed. The system includes at least the following: (1) a multilayer printed circuit board, (2) an integrated circuit placed on a surface of the printed circuit board, and (3) a capacitor array electrically coupled to ground and power terminals on the integrated circuit. The capacitor array can include two monolithic capacitors, with each capacitor including a first terminal, a second terminal, and a dielectric material between the first and second terminals. The capacitors can be positioned so that a surface including both the first and second terminals and a minimum amount of surface area is oriented downwards. Furthermore, an interposer board can be positioned between the two capacitors. The interposer board can include conductive exterior surfaces and edges except for in regions that come into contact with the second terminals on the two capacitors. The interposer board can be mechanically and electrically coupled to the capacitors in a manner that electrically couples the first terminals of the two capacitors through the interposer board.

In yet another embodiment a method for arranging capacitors on a printed circuit board (PCB) is disclosed. The method includes at least the following steps: (1) receiving two monolithic capacitors, (2) orienting the two capacitors so that a first and second terminal on each capacitor form vertical surfaces of the capacitor and a remaining surface with a smallest surface area is oriented downwards, (3) electrically and mechanically coupling an interposer board between the two capacitors, and (4) electrically and mechanically coupling a lower surface of the two capacitors and interposer board to a PCB including a land pattern configured to align with the terminals of the two capacitors and a bottom edge of the interposer board.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The described embodiments may be better understood by reference to the following description and the accompanying drawings. Additionally, advantages of the described embodiments may be better understood by reference to the following description and accompanying drawings. These drawings do not limit any changes in form and detail that may be made to the described embodiments. Any such changes do not depart from the spirit and scope of the described embodiments.

DETAILED DESCRIPTION OF SELECTED EMBODIMENTS

Figure 1:
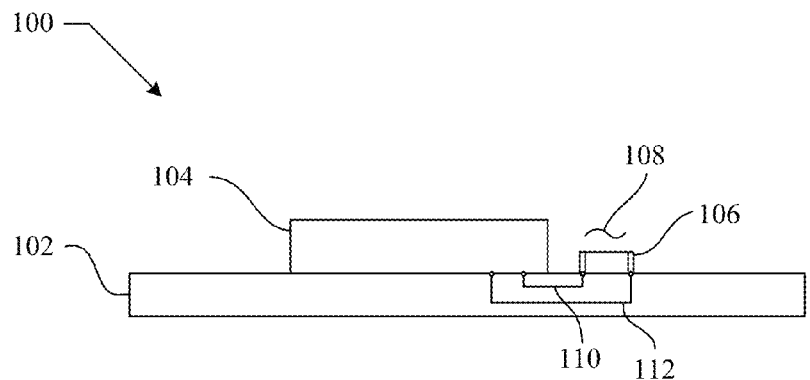
FIG. 1 shows a side view of a prior art PCB including an IC and a passive electronic component.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Passive components such as capacitors, inductors, resistors, and the like are used pervasively in electronic designs. More particularly, the passive components can be mounted on to a surface of a printed circuit board (PCB) that can include electrical interconnects also referred to as traces. However, in conventional arrangements, the passive components are laterally mounted to the PCB in such a way that valuable surface area of the PCB is utilized. In this way, the component density of the PCB is adversely affected. Therefore, reducing the amount of PCB surface area dedicated to passive components can result in both an increase in component density and ultimately a reduction in an amount of space required to house the electronic components within a device. For example, many components such as capacitors can take up more area along a base surface than along a side surface. Additionally, when mounted on a base surface, many components can be shorter than nearby components such as ICs. When the thickness of a PCB assembly is set by a component such as an IC, component density can be increased by ensuring that other components are arranged vertically to have a height similar to that of the IC.

With regards to decoupling capacitors, additional reasons can exist for increasing component density. Decoupling capacitors are often used to provide local bypassing for high frequency load components of ICs. In addition, decoupling capacitors can be used to filter noise that is produced in circuits by inductive and capacitive parasites of power supplies. In this manner, decoupling capacitors can be used to dampen voltage spikes or drops in voltage. The ability of a decoupling capacitor to correct disruptions in voltage can depend on an amount of effective series inductance and resistance included in the connection between the capacitor and the IC. In particular, longer distances between the capacitors and the IC can increase the size a resulting inductive loops, increasing the resulting amount of effective series inductance. This can slow the response of the decoupling capacitors to changes in voltage, increasing the likelihood that the IC will experience voltage dips that can cause malfunctions. Therefore, it can be advantageous to reduce the distance covered by traces connecting the decoupling capacitors to the IC and decrease the area of any resulting inductive loops.

One method of reducing the distance between the decoupling capacitors and the IC can include placing the capacitors as close as possible to the IC. However, capacitors can take up valuable area on the PCB near the IC when attached using a base surface. Moreover, capacitors can be shorter than a typical IC, leaving wasted space above the capacitor that could be used for electronic components. Capacitors can be stacked on top of one another to increase component density. However, the additional height that a trace must travel to reach a stacked capacitor can increase the amount of effective series inductance in the system, inhibiting the ability of the capacitor to respond to high frequency changes in power supply voltage. One method of addressing this problem can include creating an array of capacitors rotated on their sides and connected by a series of interposer boards. When rotated, a capacitor can take up less surface area on the PCB and attain a greater height. This increased height can be comparable to the height of a nearby IC, better utilizing the space available for electronic components. Furthermore, the interposer boards placed in between the capacitors can provide an enhanced path between the capacitor and a ground plane, reducing the resistance and effective series inductance of the connection between the capacitors and the IC.

FIG. 1 shows a side view of prior art PCB assembly 100. PCB 102 can include several conductive layers separated by substrate layers. For example, in one embodiment, PCB 102 can include multiple layers of copper or tin traces overlaid on substrate layers composed of fiberglass or a similar material. In another embodiment, a component other than a PCB can be used in place of PCB 102. For example, any substrate on which electrical components are placed can be used in place of PCB 102. Integrated circuit 104 can be coupled to PCB 102 and coupled to a number of traces included in PCB 102. In addition, multiple electronic components can be mounted to PCB 102 and connected using traces. For example, passive component 106 can be mounted to PCB 102 near IC 104.

In one embodiment, passive component 106 can represent a decoupling capacitor intended to regulate power voltage levels within IC 104. Power can be provided to passive component 106 by trace 110. Additionally, a common ground can be established between passive component 106 and IC 104 by trace 112. In one embodiment, trace 112 can represent a ground plane. For example, a large area of copper or tin foil making up one layer of the PCB can be coupled to one terminal of a power supply and serve as a return pathway for current from many different components. Similarly, trace 110 can represent a power plane. In another embodiment, traces 110 and 112 can represent individual traces directly connecting passive component 106 to balls or contact points on IC 104.

Often times, IC 104 can have a greater height than nearby electronic components such as passive component 106. For example, some ICs can have a height of approximately 1.5 mm while decoupling capacitors can be as small as 0.4 mm in height. This disparity in height can result in wasted space 108. Typically, components such as PCBs within an electronic device are mounted parallel to each other. Therefore, space can be conserved by keeping all electronic components mounted to a PCB as similar in height as possible to achieve a uniform component density. Disparities in height such as the difference between IC 104 and passive component 108 can decrease component density, increasing the size of the device containing PCB 102.

Figure 2:
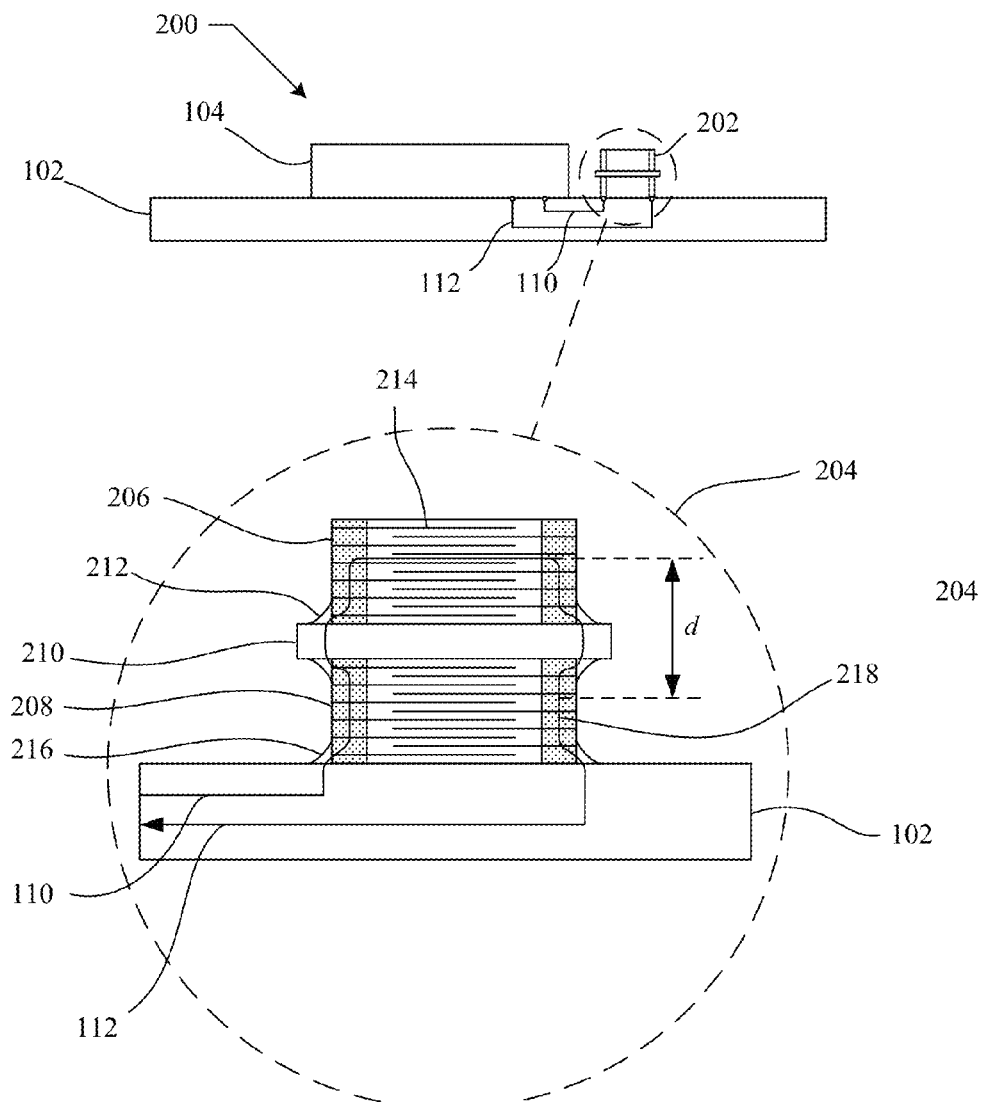
FIG. 2 shows a side view of a prior art PCB including an IC and two stacked decoupling capacitors.

FIG. 2 shows a side view of PCB assembly 200, demonstrating a prior art method for increasing component density on a PCB. PCB 102 can include IC 104 and stacked component array 202. Stacked component array 202 and IC 104 can be electrically coupled by traces 110 and 112. By vertically stacking passive components, wasted space 108 can be reduced and additional passive components can be placed near IC 104. Magnified view 204 shows a close up view of stacked component array 202 mounted to PCB 102. Stacked component array 202 is shown including upper capacitor 206 and lower capacitor 208. However, any number of components can be stacked. Moreover, passive components other than capacitors can be stacked, including inductors, resistors, and diodes.

Capacitors 206 and 208 can each include two conductive terminals separated by a dielectric such as ceramic. In some embodiments, additional electrodes 214 can extend from the conductive plates into the dielectric material, increasing the capacitance value. In other embodiments, capacitors 206 and 208 can have different capacitance values to enhance the ability of the capacitors to respond to voltage fluctuations of different frequencies and magnitudes. Interposer board 210 can be positioned between upper capacitor 206 and lower capacitor 208. Interposer board 210 can be electrically and mechanically bonded to upper capacitor 206 and lower capacitor 208 using solder 212. In another embodiment, upper capacitor 206 and lower capacitor 208 can be coupled to interposer board 210 using a conductive adhesive or any other technically feasible means of mechanically and electrically forming a bond. Similarly, lower capacitor 208 can be mechanically and electrically coupled to a corresponding land pattern on PCB 102 using solder or conductive adhesive. The land pattern can be coupled to traces connecting capacitors 206 and 208 to power and ground or any two voltage nodes. When stacked component array 202 includes decoupling capacitors, the close proximity to IC 104 can decrease resistance in traces 110 and 112, enhancing a capability of the decoupling capacitors to respond to high frequency changes in voltage.

However, there can be disadvantages to vertically stacking passive components. Path 218 shows a path that current can follow when directed from IC 104, through upper capacitor 206, and back to IC 104. By stacking components, current flowing through upper capacitor 206 must on average travel an additional vertical distance d above ground plane 112. This can be problematic for several reasons. First, the additional height can increase effective series inductance. Path 218 can create an inductive loop. Moreover, the inductance of a wire loop can be directly proportional to the area of the loop. By adding distance d to the height that current must travel to pass through upper capacitor 206, the area of the inductive loop formed by path 218 can be approximately doubled. This can increase the inductance of the overall system, slowing the ability of upper capacitor 206 to respond to high frequency fluctuations in voltage from IC 104. If more than two capacitors are stacked, the effect can be even greater. Secondly, distance d increases an amount of conductive material through which current must flow along path 218. This can increase resistance along traces 110 and 112, further slowing the ability of the system to respond to voltage fluctuations.

Figure 3:
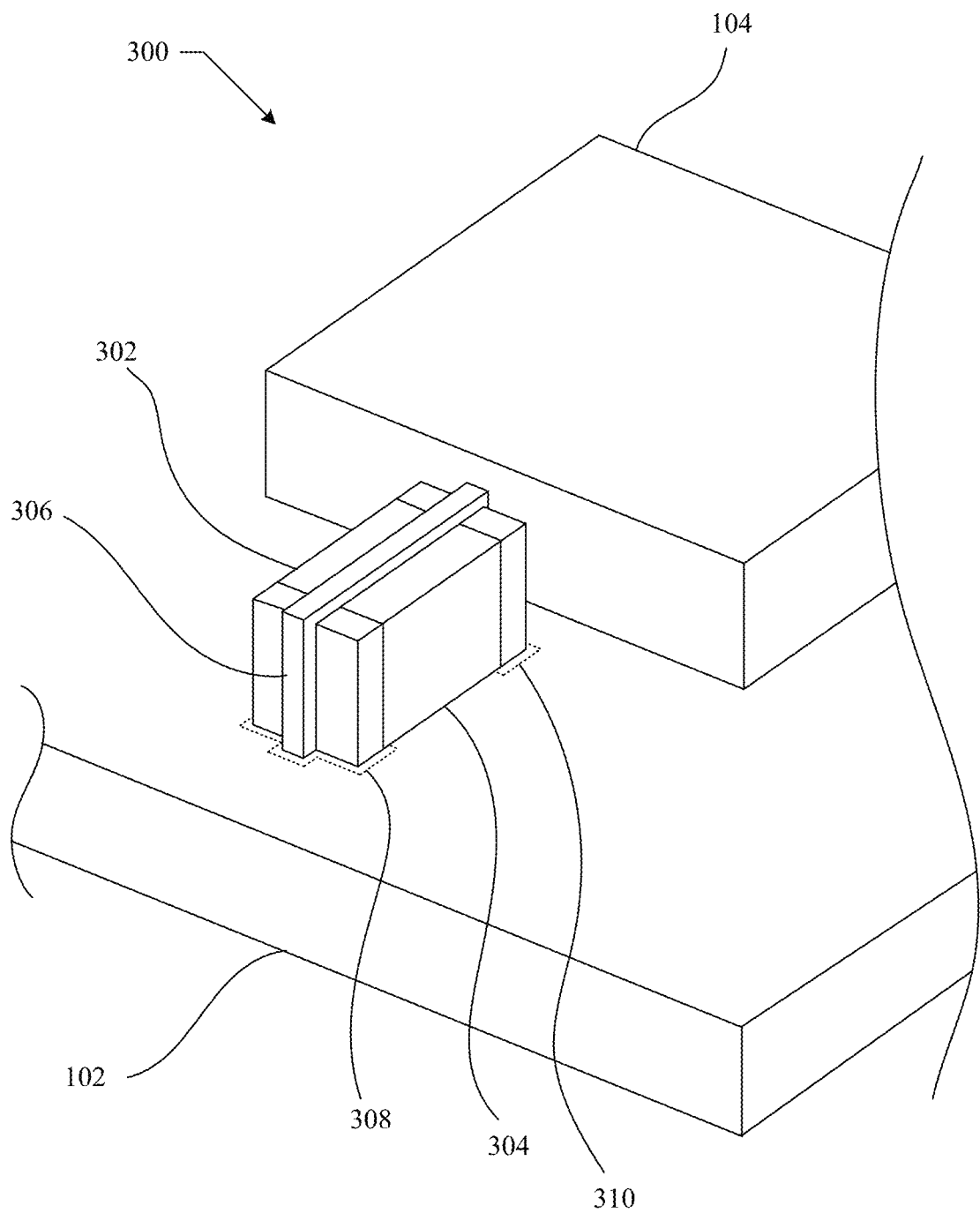
FIG. 3 shows an isometric view of a PCB including an IC and a capacitor array.

FIG. 3 shows PCB assembly 300. PCB 102 can include several conductive layers separated by substrate layers. For example, in one embodiment, PCB 102 can include multiple layers of copper or tin traces overlaid on substrate layers composed of fiberglass or a similar material. In another embodiment, a component other than a PCB can be used in place of PCB 102. For example, any substrate on which electrical components are placed can be used in place of PCB 102. Integrated circuit 104 can be coupled to PCB 102 and coupled to a number of traces included in PCB 102.

A capacitor array including first capacitor 302, second capacitor 304, and interposer board 306 can be mechanically and electrically coupled to PCB 102 near IC 104. First capacitor 302 and second capacitor 304 can be rotated 90 degrees from their typical orientation so the capacitors are contacting PCB 102 along a side. Monolithic capacitors are typically wider than they are tall, so rotating capacitors 302 and 304 in this manner can increase the height of the capacitors while decreasing an amount of surface area used on PCB 102. In some embodiments, the height of capacitors 302 and 304 when rotated 90 degrees can be comparable to the height of IC 104. This can increase the efficient use of space within a device containing PCB assembly 300. Moreover, additional surface area can be created near IC 104, potentially providing space for additional capacitors or other electronic components. PCB assembly 300 is depicted including a rotated array of capacitors. However, any passive electrical component can be mounted in a similar fashion. For example, inductors, diodes, and resistors that are wider than they are tall can be rotated and mounted in a similar fashion to increase component density.

Interposer board 306 can provide mechanical support for capacitors 302 and 304 as well as a conductive path for coupling capacitors 302 and 304 to a ground plane. Interposer board 306 can be composed of a two layer PCB. For example, interposer board 306 can include a substrate layer such as FR-4 with copper or tin layers placed on both surfaces to provide conductive traces. However, interposer board 306 can be composed of materials other than PCBs. Any other technically feasible substitute with similar physical characteristics compared to a PCB can be used. More detail regarding interposer board 306 can be seen in FIGS. 5A and 5B. Land patterns 308 and 310 can be included in PCB 110 and configured to align with conductive elements on first capacitor 302, second capacitor 304 and interposer board 306. More detail regarding land patterns 308 and 310 are shown in FIGS. 6A and 6B.

Figure 4:
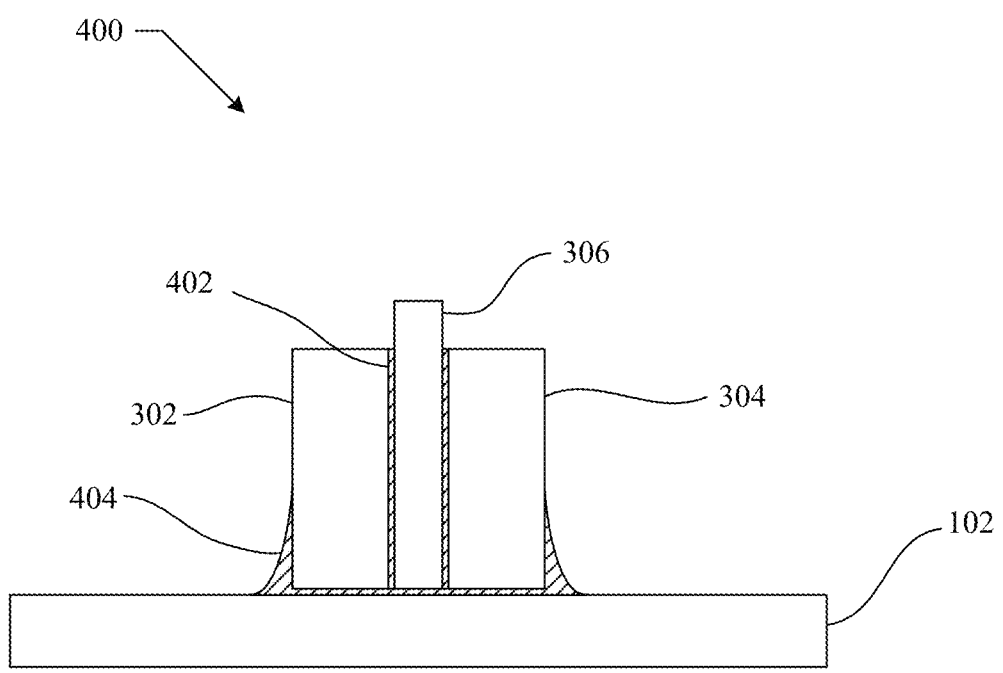
FIG. 4 shows a cross-sectional view of a capacitor array coupled to a PCB.

FIG. 4 shows a cross-sectional view of PCB assembly 400, demonstrating how various components of the capacitor array and PCB 102 can be coupled together. Capacitors 302 and 304 can be electrically and mechanically coupled to interposer board 306 using solder 402. Solder 402 can extend from a ground end of capacitors 302 and 304 and stop short of a power end to prevent current from bypassing capacitors 302 and 304. More detail regarding the connection between interposer board 306 and capacitors 302 and 304 can be seen in FIGS. 5A and 5B. In an alternative embodiment, capacitors 302 and 304 can be coupled to interposer board 306 using any technically feasible means of forming a robust and low impedance connection. For example, a conductive adhesive or conductive tape can be used to mechanically and electrically couple capacitors 302 and 304 to interposer board 306.

Additionally, solder connection 404 can be provided between the capacitor array and a corresponding land pattern on PCB 102. For more detail on the land pattern, see FIGS. 6A and 6B. Solder connection 404 can provide a robust and reliable means of mechanically and electrically coupling the capacitor array to PCB 102. In an alternative embodiment, solder 404 can be replaced by any other feasible means of creating a robust low impedance connection, such as conductive adhesive or tape.

Figure 5A:
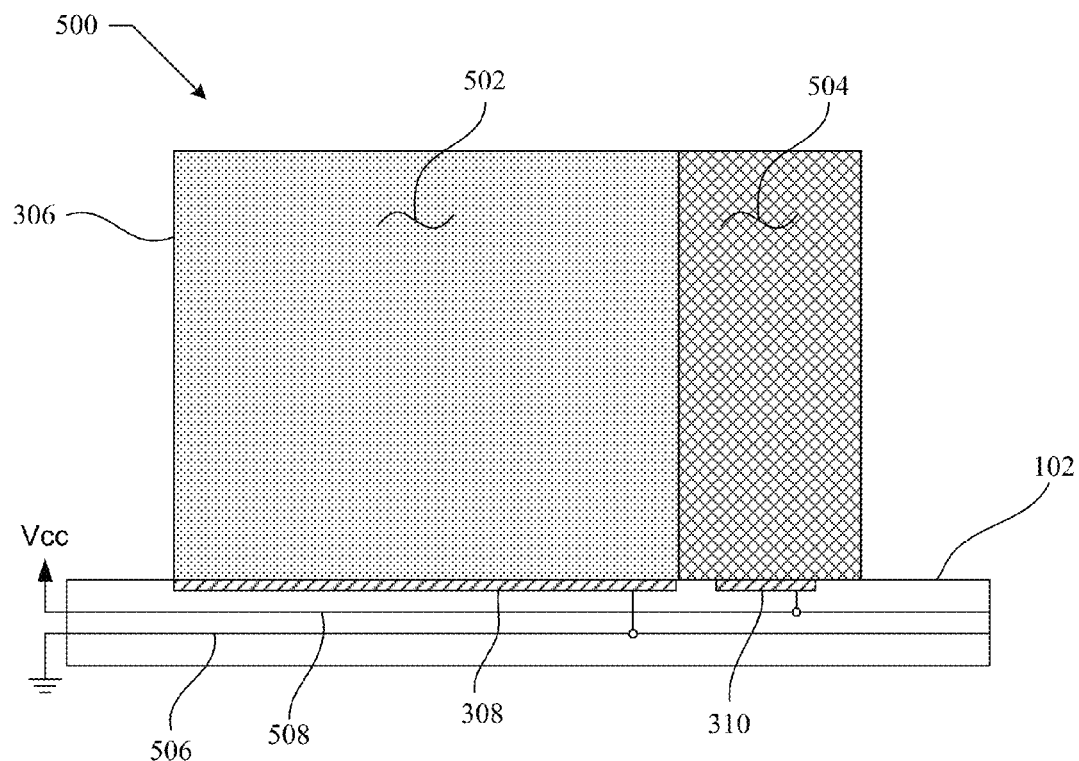
FIG. 5A shows a cross-sectional view of a PCB including an interposer board capable of being used in a capacitor array.
Figure 6A:
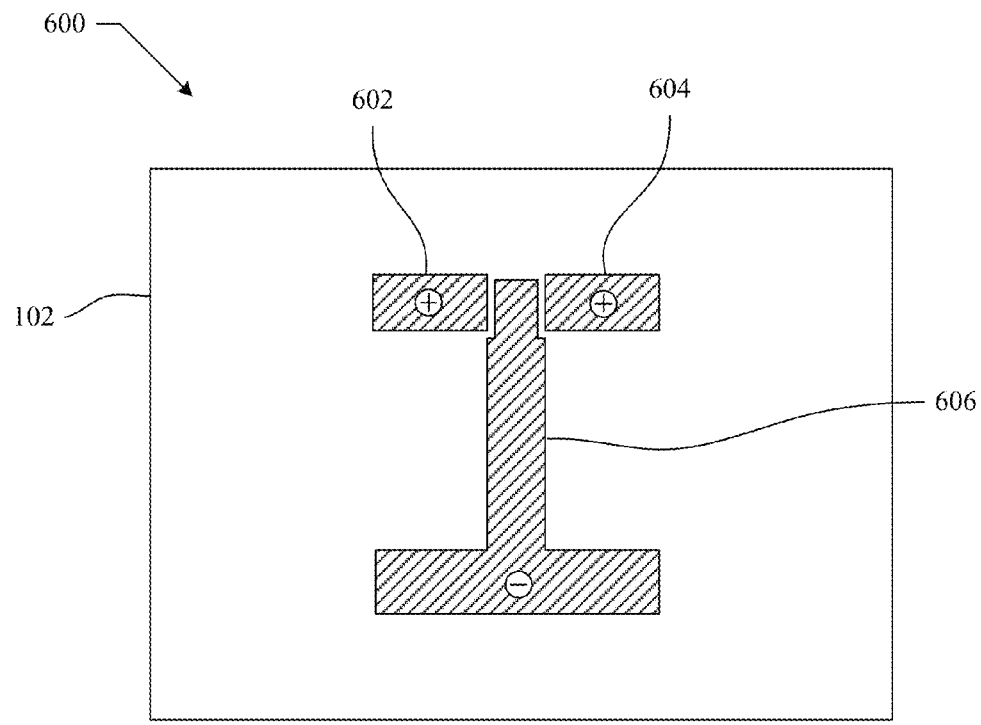
FIG. 6A shows a plan view of a PCB including a land pattern for a capacitor array.
Figure 6B:
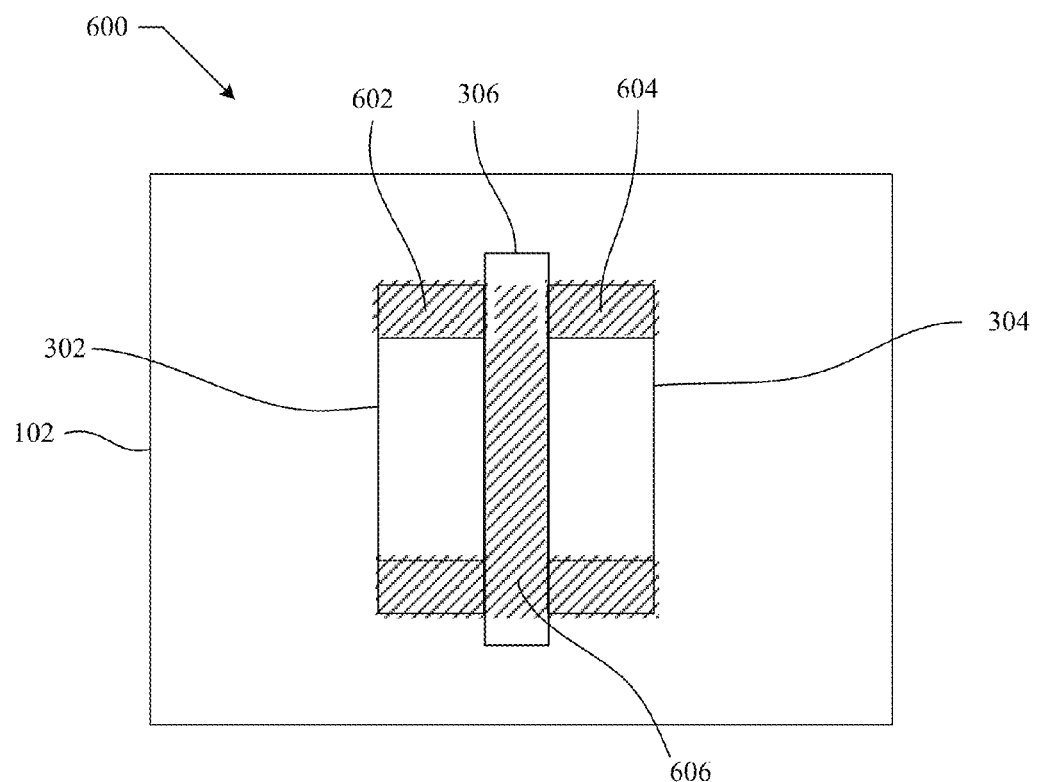
FIG. 6B shows a plan view of a PCB including a land pattern and a capacitor array.

FIG. 5A shows a cross sectional view of PCB assembly 500, showing a side surface of interposer board 306. Interposer board 306 can be composed of a two layer PCB. However, interposer board 306 can be composed of materials other than PCBs. Any other technically feasible substitute with similar physical characteristics compared to a PCB can be used. In one embodiment, interposer board 306 can include a substrate layer such as FR-4 with copper or tin plating placed on the surfaces and edges to provide a conductive area. Region 502 represents an area in which a conductive material such as copper plating can be exposed. Region 504 represents an area coated with solder mask to prevent any components in contact with region 504 from creating an electrical path to the conductive layer in region 502. In another embodiment, region 504 can be coated in other insulative materials besides solder mask. Alternatively, the conductive layer can be etched away in region 504 to leave an underlying nonconductive substrate exposed. Land pattern 308 can be included in PCB 102 and coupled to ground plane 506. Similarly, land pattern 310 can be included in PCB 102 and coupled to power plane 508. Interposer board 306 can be electrically coupled to land pattern 308 in region 502 to provide a conductive path between conductive surface 502 and ground plane 506.

Figure 5B:
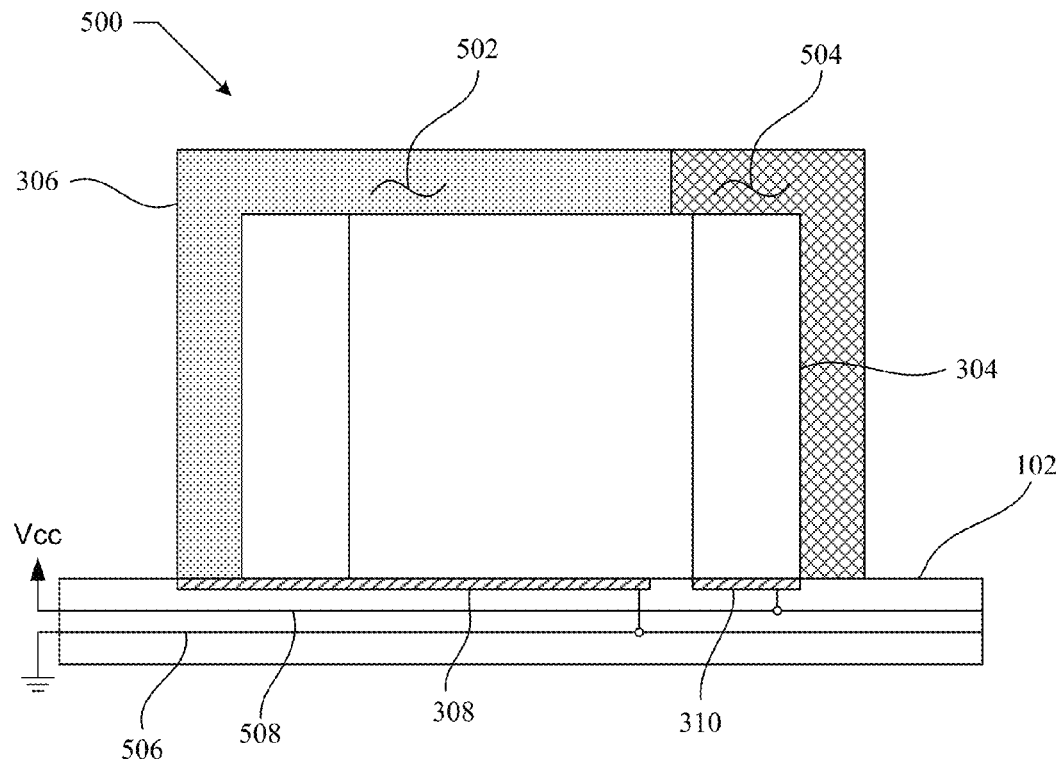
FIG. 5B shows a cross-sectional view of a PCB including an interposer board capable of being used in a capacitor array and a capacitor.

FIG. 5B shows a side view of PCB assembly 500, including capacitor 304. A ground terminal of capacitor 304 can be electrically coupled to conductive region 502 of interposer board 306. Furthermore, the ground terminal of capacitor 304 can be electrically coupled to land pattern 308 along with interposer board 306 using solder or any other technically feasible means of creating a low impedance connection. In addition, a power terminal of capacitor 304 can be electrically coupled to land pattern 310 using means similar to the ground terminal. The amount of effective series inductance in a loop from power plane 508 through capacitor 304 and back to ground plane 506 can be reduced because the flow of current is closer to ground plane 506 than if the capacitors were stacked vertically. Moreover, current can tend to follow the least inductive path possible. Thus, a majority of charge can flow through a bottom portion of capacitor 304, further reducing the area of the resulting inductive loop. By lowering the effective series inductance of the system, the response time that it takes for capacitor 304 to respond to a high frequency change in a corresponding IC can be reduced, reducing the likelihood of voltage dips in the IC.

FIG. 6 shows an overhead view of PCB 600. FIG. 6A shows a land pattern on PCB 102 for a rotated capacitor array including two capacitors and an interposer board. Region 606 can be configured to align with interposer board 304 and provide a conductive pad electrically coupled to ground plane 506. Similarly, regions 602 and 604 can be configured to align with power terminals on the capacitors and can be electrically coupled to power plane 508 supplying power for a corresponding IC. In an alternative embodiment, traces in PCB 102 can connect directly to power and ground terminals on the corresponding IC, negating a need for ground plane 506 and power plane 508. FIG. 6B shows capacitors 302 and 304 and interposer board 306 aligned with the corresponding land pattern in PCB 102. Both the ground terminals of capacitors 302 and 304 and the full length of interposer board 306 can be electrically coupled to land pattern 606. The T shaped configuration of land pattern 606 can allow current to flow from capacitors 302 and 304 to ground plane 506 more efficiently, reducing the amount of resistance and effective series inductance contained within the system. The power terminals of capacitors 302 and 304 can then be electrically coupled to land patterns 602 and 604 respectively, providing an efficient means of transmitting power from power plane 506 to capacitors 302 and 304. Both interposer board 306 and capacitors 302 and 304 can be mechanically and electrically coupled to land patterns 602, 604, and 606 using solder or any other technically feasible means of providing a robust low impedance connection.

Figure 7A:
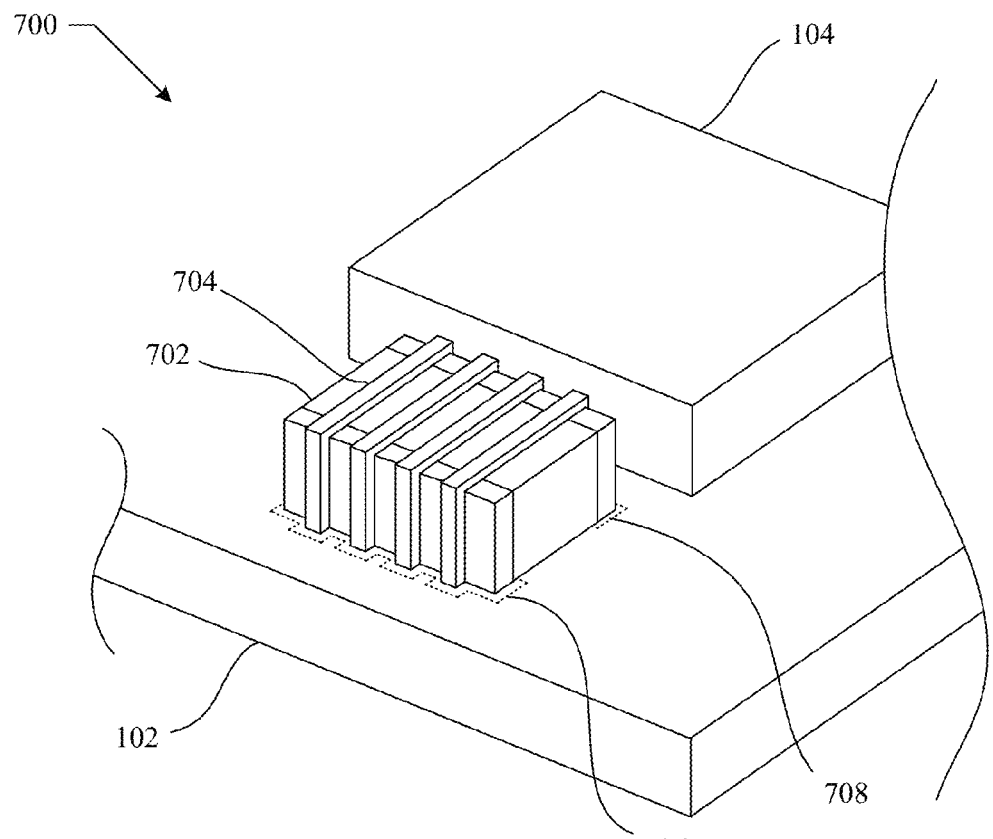
FIG. 7A shows an isometric view of a PCB including an IC and a capacitor array including an increased number of capacitors.

FIG. 7A shows an isometric view of PCB assembly 700, demonstrating another embodiment of the present disclosure. PCB assembly 700 can include PCB 102, IC 104, and a rotated capacitor array containing a number of capacitors 702 and interposer boards 704. Interposer boards 704 can be composed of materials similar to interposer board 306 described in previous embodiments. Furthermore, Interposer board 704 can be electrically and mechanically coupled to capacitors 702 using methods described in other embodiments of the current disclosure. Landing pad 706 can be provided to electrically couple the ground terminals of capacitors 702 and bottom edges of interposer boards 704 to ground plane 506 or a trace in PCB 102 connecting to a ground ball on IC 104. Similarly, landing pads 708 can be placed under each power terminal of capacitors 702 to electrically couple the power terminals to power plane 508 or traces in PCB 102 connecting to a Vcc ball on IC 104.

Figure 7B:
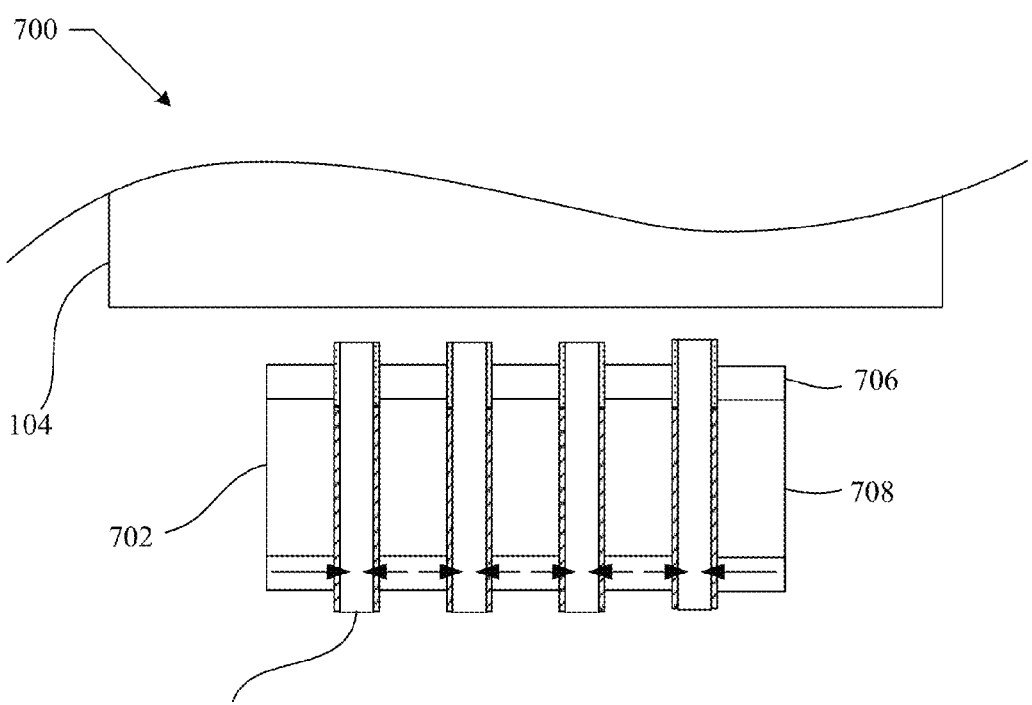
FIG. 7B shows an overhead view of a capacitor array.
Figure 8A:
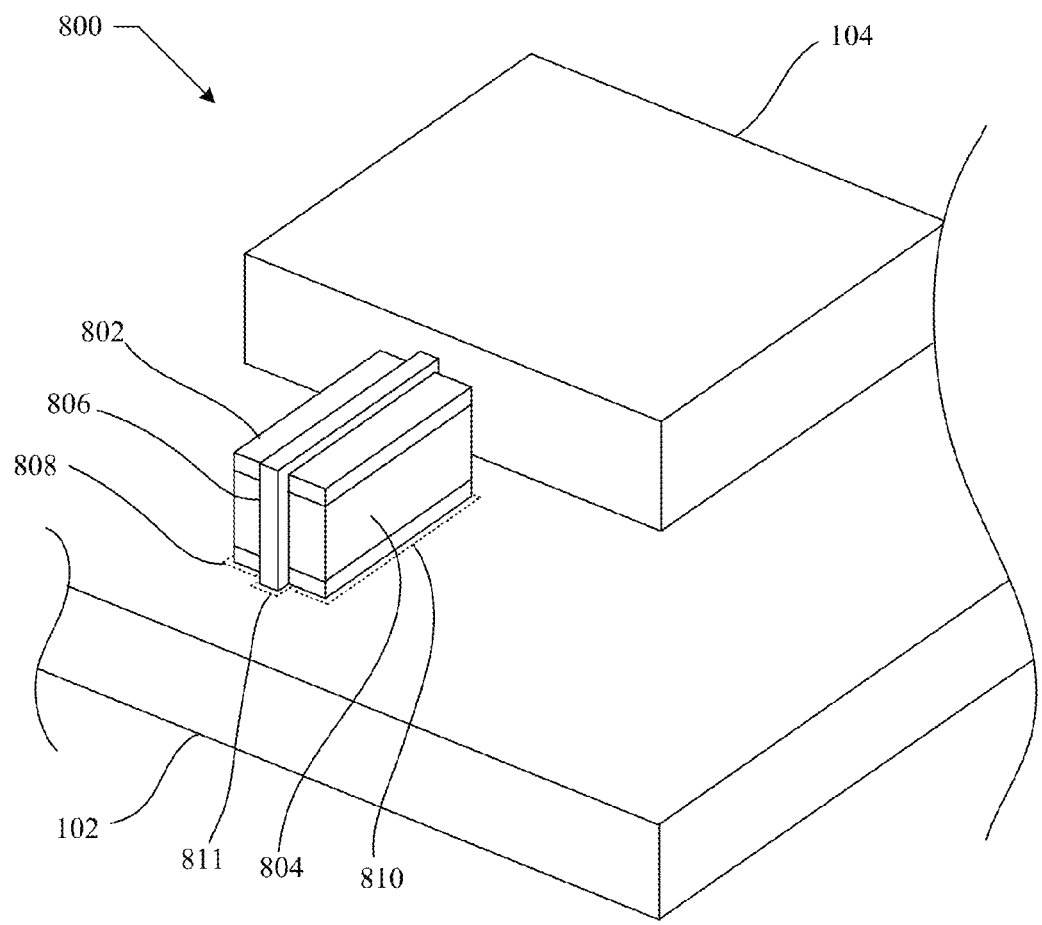
FIG. 8A shows an isometric view of a PCB including an IC and a capacitor array with capacitors rotated 90 degrees.

FIG. 7B shows an overhead view of PCB assembly 700, illustrating an arrangement of a rotated capacitor array along an edge of IC 104. There can be several advantages to creating a capacitor array with a large number of rotated capacitors. First, the rotated design takes of less surface area on PCB 102, allowing more capacitors to be placed closer to IC 104 and leaving more room for additional electronic components. Second, including an array of capacitors can allow different capacitance values to be assigned to different capacitors within the array. This can improve the ability of a group of power decoupling capacitors to respond to a wide variety of changes in voltage within IC 104. For example, capacitors with large capacitance values can contain relatively large amounts of charge, allowing a greater amount of current to be supplied during large voltage dips. On the other hand, capacitors with smaller capacitance values can respond more quickly to voltage disruptions that occur at a relatively high frequency. By including both high and low capacitance values in a ray of capacitors, the ability of the capacitor array to respond to a variety of different conditions can therefore be enhanced. Finally, current flowing through inner capacitors (capacitors surrounded on both sides by interposer boards 704) can travel a shorter distance because the current can flow into whichever interposer board is closer before returning to IC 104 by ground plane 506. Arrows shown in FIG. 7B demonstrate how current can flow in either direction depending on which completes the circuit in the shortest distance FIG. 8A shows PCB assembly 800, demonstrating yet another embodiment of the present disclosure. PCB assembly 800 can include PCB 102, IC 104, and a capacitor array composed of interposer board 806 and capacitors 802 and 804. Unlike previous embodiments, capacitors 802 and 804 can be further rotated so that one set of terminals rests on PCB 102 and another set of terminals are located along a top surface of capacitors 802 and 804. In one embodiment, the ground terminals of capacitors 802 and 804 can be oriented downwards and electrically coupled to land patterns 808 and 810. Land patterns 808 and 810 can then couple capacitors 802 and 804 to ground plane 506. The power terminals located along the top surfaces of capacitors 802 and 804 can be electrically coupled to traces in interposer board 806 that can transmit current through land pattern 811 to power plane 508. In yet another embodiment, capacitors 802 and 804 can be rotated 180 degrees so that the ground terminals are located on a top surface and the power terminals are located on a lower surface. PCB assembly 800 can result in a higher effective series inductance than previously described embodiments, but can offer the same space savings and simplified land patterns on PCB 102. In other embodiments, PCB assembly 800 can include any number of capacitors and interposer boards.

Figure 8B:
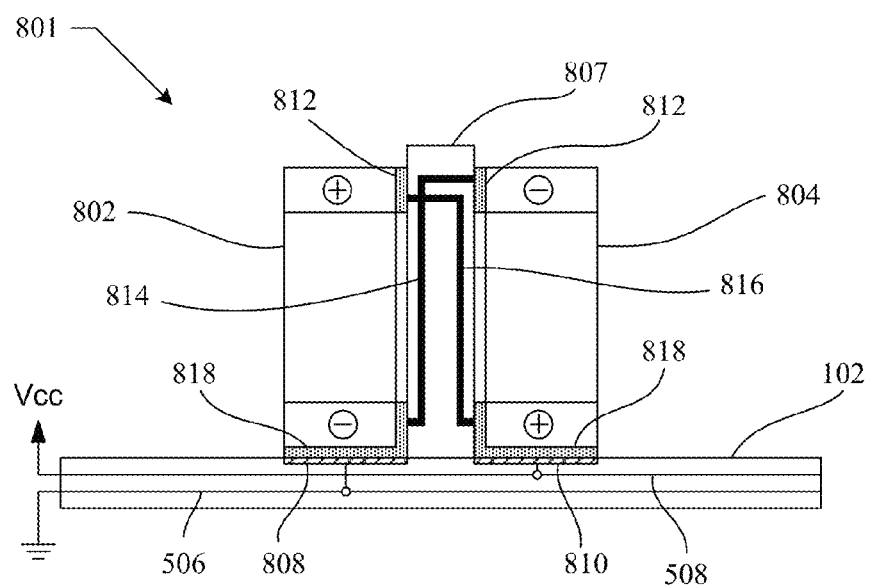
FIG. 8B shows a cross-sectional view of a PCB coupled to a capacitor array with capacitors rotated 90 degrees.

FIG. 8B shows PCB assembly 801, demonstrating still another embodiment of the present disclosure. PCB assembly 801 can include PCB 102, IC 104, and a capacitor array including interposer board 806 and capacitors 802 and 804 similar to PCB assembly 800 shown in FIG. 8A. However, the polarities of adjacent capacitors can be reversed. Terminals at the top surfaces of capacitors 802 and 804 can be electrically coupled to traces 816 and 814 respectively using solder 812 or any other suitable method for forming an electrical connection. Traces 816 and 814 can then couple the upper terminals of the capacitors to the lower terminals of adjacent capacitors, allowing multiple capacitors to operate in parallel. Solder 818 can electrically couple traces 816 and 814 to the lower terminals of capacitors 802 and 804 as well as land patterns 808 and 810 in PCB 102. Similar to PCB assembly 800, PCB assembly 801 can result in a higher effective series inductance than previously described embodiments, but can offer the same space savings and simplified land patterns on PCB 102. In other embodiments, PCB assembly 801 can include any number of capacitors and interposer boards.

Figure 9:
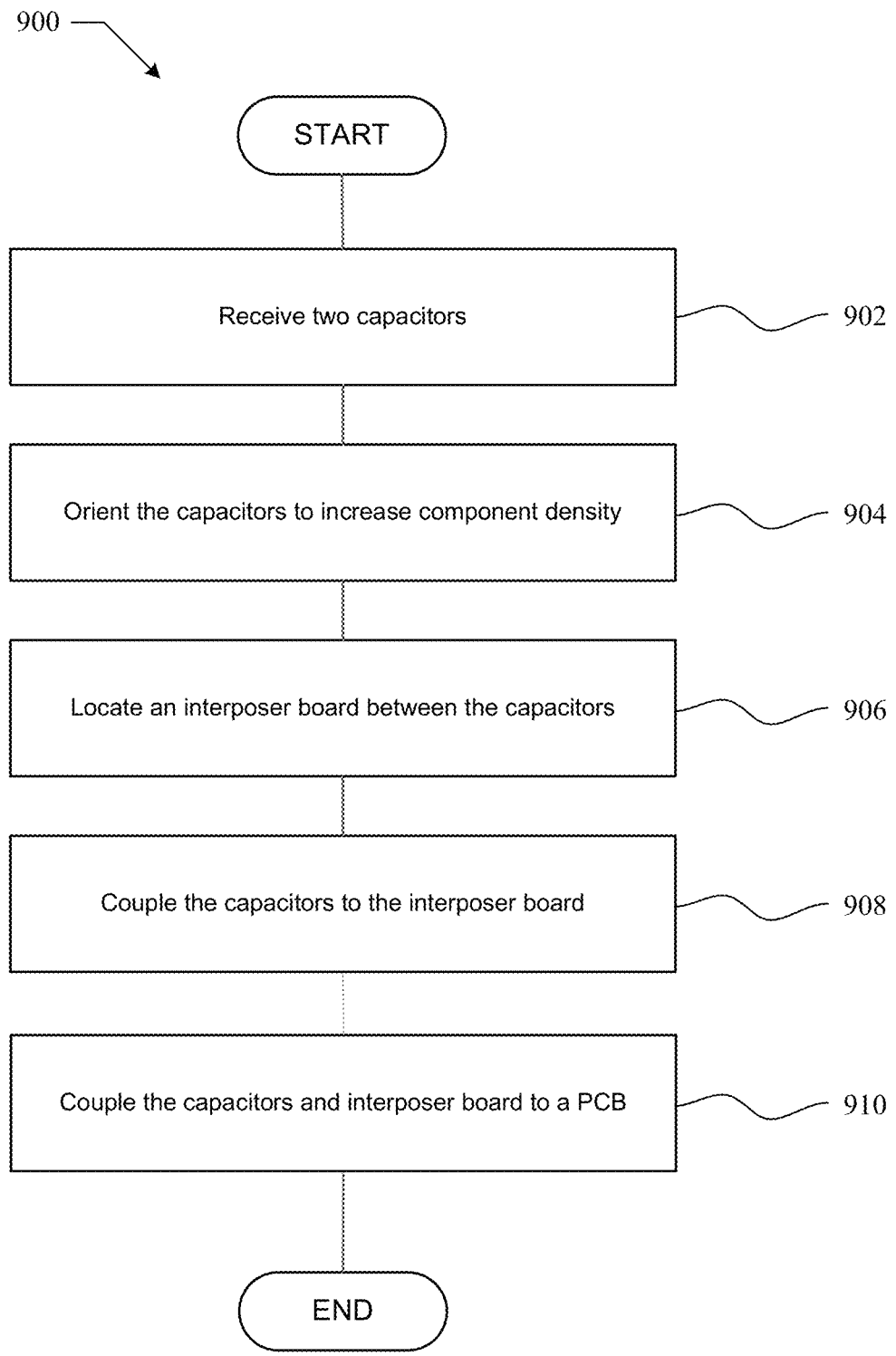
FIG. 9 shows a flow chart describing a process for arranging capacitors on a PCB.

FIG. 9 shows a flow chart describing process 900 for arranging capacitors on a PCB in accordance with the described embodiments. In step 902, two capacitors are received. The capacitors can be monolithic in shape and can include a first terminal, a second terminal, and a dielectric material positioned between the first terminal and the second terminal. In step 904, the two capacitors are oriented so that the first and second terminals form vertical surfaces of the capacitor and the remaining surface with the smallest surface area is oriented downwards, thereby increasing component density on the PCB. In step 906, an interposer board can be located between the two capacitors. The interposer board can have an exterior surface and edges that are conductive except for a region that comes into contact with the second terminals of the two capacitors. In step 908, the interposer board can be electrically and mechanically coupled to the two capacitors using any technically feasible means. Finally, in step 910, the lower surface of the two capacitors and the lower edge of the interposer board can be mechanically and electrically coupled to a surface of the PCB.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A capacitor array for mounting on a printed circuit board, the capacitor array comprising:
    capacitors, wherein each capacitor of the capacitors includes:
        (i) a transverse surface having a first terminal and a second terminal, and
        (ii) a dielectric material disposed between the first terminal and the second terminal; and
    an interposer board configured to extend perpendicular to the printed circuit board and contact each capacitor of the capacitors, wherein the interposer board includes opposing conductive surfaces in contact with co-planar first terminals of two of the capacitors to provide a conductive pathway between the co-planar first terminals.

2. The capacitor array as recited in claim 1, further comprising:
    an additional interposer board substantially parallel to the interposer board and disposed between at least two of the capacitors, wherein the additional interposer board includes opposing conductive surfaces in contact with co-planar first terminals of one of the capacitors to provide a conductive pathway between the co-planar first terminals.

3. The capacitor array as recited in claim 1, wherein the interposer board further comprises a two layer printed circuit board.

4. The capacitor array as recited in claim 3, wherein the capacitors have different capacitance values.

5. The capacitor array as recited in claim 4, wherein the capacitors are electrically and mechanically coupled to the interposer board using solder.

6. A system for decoupling a power supply to an integrated circuit, the system comprising:
    a printed circuit board;
    an integrated circuit disposed on a surface of the printed circuit board; and
    a capacitor array electrically coupled to ground and power terminals on the integrated circuit, the capacitor array further comprising:
        capacitors, wherein each capacitor includes an exterior surface that extends across a first terminal and a second terminal, and
        an interposer board extending perpendicular to the printed circuit board and disposed between the capacitors, wherein the interposer board includes opposing conductive surfaces that contact co-planar first terminals of the capacitors.

7. The system as recited in claim 6, wherein the capacitor array further comprises:
    an additional interposer board parallel to the interposer board and disposed between the capacitors, wherein opposing surfaces of the additional interposer board abut at least one of the capacitors.

8. The system as recited in claim 7, the printed circuit board further comprising a ground plane and a power plane, wherein the first terminals of the capacitors and a bottom edge of each of the interposer boards are electrically coupled to the ground plane and the second terminals of the capacitors are electrically coupled to the power plane.

9. The system as recited in claim 7, wherein the capacitor array is electrically coupled to the ground and power terminals on the integrated circuit using traces included in the printed circuit board.

10. The system as recited in claim 8, wherein the printed circuit board further comprises:
a first land pattern configured to align with the first terminals of the capacitors and the bottom edges of each of the interposer boards, wherein the first land pattern is electrically coupled to the ground plane; and
three additional land patterns configured to align with the second terminals of the capacitors and electrically coupled to the power plane.

11. The system as recited in claim 10, wherein the capacitor array is electrically and mechanically coupled to the first and three additional land patterns on the printed circuit board using solder.

12. The system as recited in claim 11, wherein each of the interposer boards further comprise a two layer printed circuit board.

13. The system as recited in claim 12, wherein the capacitors have different capacitance values.

14. A computing device, comprising:
a capacitor array for mounting on a printed circuit board, the capacitor array comprising:
capacitors, wherein each capacitor of the capacitors includes:
(i) a transverse surface having a first terminal and a second terminal, and
(ii) a dielectric material disposed between the first terminal and the second terminal; and
an interposer board configured to extend perpendicular to the printed circuit board and contact each capacitor of the capacitors, wherein the interposer board includes opposing conductive surfaces in contact with co-planar first terminals of two of the capacitors to provide a conductive pathway between the co-planar first terminals.

15. The computing device as recited in claim 14, further comprising:
an additional interposer board substantially parallel to the interposer board and disposed between at least two of the capacitors, wherein the additional interposer board includes opposing conductive surfaces in contact with co-planar first terminals of one of the capacitors to provide a conductive pathway between the co-planar first terminals.

16. The computing device as recited in claim 14, wherein the interposer board further comprises a two-layer printed circuit board.

17. The computing device as recited in claim 16, wherein the capacitors have different capacitance values.

18. The computing device as recited in claim 14, wherein the capacitors are electrically and mechanically coupled to the interposer board using solder.

19. The computing device as recited in claim 14, wherein the capacitors are electrically and mechanically coupled to the interposer board using a conductive adhesive.

20. The computing device as recited in claim 14, wherein the capacitor array is arranged in a stacked arrangement that includes one or more of an inductor, a resistor, and/or a diode.

* * * * *